United States Patent
Hsieh

(10) Patent No.: US 8,110,427 B2
(45) Date of Patent: Feb. 7, 2012

(54) STACKED-LAYERED THIN FILM SOLAR CELL AND MANUFACTURING METHOD THEREOF

(75) Inventor: Feng-Chien Hsieh, Houli Township, Taichung County (TW)

(73) Assignee: Nexpower Technology Corp., Taichung County (TW)

( * ) Notice: Subject to any disclaimer, the term of this patent is extended or adjusted under 35 U.S.C. 154(b) by 351 days.

(21) Appl. No.: 12/607,204

(22) Filed: Oct. 28, 2009

(65) Prior Publication Data

US 2010/0129953 A1 May 27, 2010

(30) Foreign Application Priority Data

Nov. 25, 2008 (TW) ................. 97145419 A

(51) Int. Cl.
*H01L 25/00* (2006.01)
*H01L 31/109* (2006.01)

(52) U.S. Cl. ............... 438/94; 438/48; 438/87; 438/93; 438/95; 438/104; 438/116; 257/21; 257/76; 257/184; 257/185; 257/191; 257/200; 257/201; 257/436

(58) Field of Classification Search .......... 438/48, 438/57, 69, 73, 87, 93–95, 102, 104, 116; 257/12, 21, 76, 183–185, 191, 200–201, 257/436–437, E25.004, E25.007, E25.009, 257/E27.122–E27.126
See application file for complete search history.

(56) References Cited

U.S. PATENT DOCUMENTS

| | | | | |
|---|---|---|---|---|
| 4,335,266 A | * | 6/1982 | Mickelsen et al. | 136/260 |
| 4,523,051 A | * | 6/1985 | Mickelsen et al. | 136/260 |
| 4,684,761 A | * | 8/1987 | Devaney | 136/258 |
| 4,795,501 A | * | 1/1989 | Stanbery | 136/249 |
| 4,867,801 A | * | 9/1989 | Stanbery | 136/249 |
| 5,045,409 A | * | 9/1991 | Eberspacher et al. | 428/620 |
| 5,141,564 A | | 8/1992 | Chen et al. | |
| 5,229,627 A | * | 7/1993 | Kosaka | 257/85 |
| 5,286,306 A | * | 2/1994 | Menezes | 136/249 |

(Continued)

OTHER PUBLICATIONS

CIGSS Thin Film Solar Cells, N.G. Dhere, Florida Solar Enegry Center, Cocoa, Florida, Oct. 11, 2001-Jun. 30, 2005.*

*Primary Examiner* — Matthew Landau
*Assistant Examiner* — Maliheh Malek
(74) *Attorney, Agent, or Firm* — Ming Chow; Sinorica, LLC

(57) ABSTRACT

A stacked-layered thin film solar cell and a manufacturing method thereof are provided. The stacked-layered thin film solar cell includes a front electrode layer, a stacked-layered light-absorbing structure, and a back electrode layer. The stacked-layered light-absorbing structure has a p-i-n-type layered structure and consists essentially of I-III-VI compounds, wherein the group III elements at least include indium (In) and aluminum (Al). The p-type layer of the stacked-layered light-absorbing structure is near the front electrode layer while the n-type layer is near the back electrode layer. The Al/In concentration ratio in the p-type layer is higher than that in the n-type layer.

20 Claims, 5 Drawing Sheets

U.S. PATENT DOCUMENTS

| | | | | |
|---|---|---|---|---|
| 5,578,502 A * | 11/1996 | Albright et al. | | 438/95 |
| 5,612,229 A * | 3/1997 | Yoshida | | 438/72 |
| 5,911,839 A * | 6/1999 | Tsai et al. | | 136/262 |
| 5,981,868 A * | 11/1999 | Kushiya et al. | | 136/262 |
| 6,294,795 B1 * | 9/2001 | Kano | | 257/21 |
| 6,309,459 B1 * | 10/2001 | Yuge | | 117/105 |
| 6,323,417 B1 * | 11/2001 | Gillespie et al. | | 136/262 |
| 7,488,890 B2 * | 2/2009 | Takamoto et al. | | 136/255 |
| 7,560,641 B2 * | 7/2009 | Menezes | | 136/264 |
| 7,919,710 B2 * | 4/2011 | Lu et al. | | 136/252 |
| 7,977,139 B2 * | 7/2011 | Kushiya et al. | | 438/57 |
| 8,021,905 B1 * | 9/2011 | Nath et al. | | 438/46 |
| 2002/0043279 A1 * | 4/2002 | Karg | | 136/262 |
| 2006/0204659 A1 * | 9/2006 | Choi | | 427/248.1 |
| 2008/0092954 A1 * | 4/2008 | Choi | | 136/262 |
| 2008/0251120 A1 * | 10/2008 | Malmstrom et al. | | 136/256 |
| 2009/0020782 A1 * | 1/2009 | Pan et al. | | 257/185 |
| 2009/0078318 A1 * | 3/2009 | Meyers et al. | | 136/260 |
| 2009/0117679 A1 * | 5/2009 | Fritzemeier | | 438/46 |
| 2009/0130796 A1 * | 5/2009 | Taunier et al. | | 438/94 |
| 2009/0208636 A1 * | 8/2009 | Choi | | 427/76 |
| 2009/0250722 A1 * | 10/2009 | Bruce et al. | | 257/184 |
| 2009/0272432 A1 * | 11/2009 | Lu et al. | | 136/256 |
| 2009/0308437 A1 * | 12/2009 | Woods et al. | | 136/255 |
| 2010/0024872 A1 * | 2/2010 | Kishimoto et al. | | 136/255 |
| 2010/0024878 A1 * | 2/2010 | Nasuno | | 136/256 |
| 2010/0075457 A1 * | 3/2010 | Hsieh | | 438/93 |
| 2010/0078072 A1 * | 4/2010 | Nishida et al. | | 136/261 |
| 2010/0096003 A1 * | 4/2010 | Hobbie | | 136/254 |
| 2010/0098856 A1 * | 4/2010 | Choi | | 427/255.28 |
| 2010/0116329 A1 * | 5/2010 | Fitzgerald et al. | | 136/256 |
| 2010/0122726 A1 * | 5/2010 | Lee | | 136/255 |
| 2010/0282320 A1 * | 11/2010 | Meyers et al. | | 136/260 |
| 2010/0288358 A1 * | 11/2010 | Bruce et al. | | 136/260 |
| 2010/0291714 A1 * | 11/2010 | Hesse et al. | | 438/16 |
| 2010/0311202 A1 * | 12/2010 | Hakuma et al. | | 438/95 |
| 2011/0092012 A1 * | 4/2011 | Mashima et al. | | 438/87 |
| 2011/0197957 A1 * | 8/2011 | Yoshikawa et al. | | 136/255 |
| 2011/0197967 A1 * | 8/2011 | Kaijo et al. | | 136/256 |
| 2011/0206599 A1 * | 8/2011 | Keszler et al. | | 423/508 |

* cited by examiner

STACKED-LAYERED THIN FILM SOLAR CELL AND MANUFACTURING METHOD THEREOF

BACKGROUND OF THE INVENTION

1. Technical Field

The present invention relates to a thin film solar cell and a manufacturing method thereof. More particularly, the present invention relates to a stacked-layered thin film solar cell whose light-absorbing layer has a p-i-n-type structure, and a method for making the same.

2. Description of Related Art

According to current thin film solar cell technology, thin film solar cells based on semiconductors layers of copper indium gallium diselenide (abbreviated as CIGS) are one of the most efficient solar cells of today. Formerly, the predecessor of the CIGS thin film solar cells consisted essentially of copper (Cu), indium (In), and selenium (Se) and is therefore known as the CIS ($CuInSe_2$, copper indium selenide) thin film solar cell. It was not until gallium (Ga) or sulfur (S) was subsequently incorporated into the CIS thin film solar cells that the CIGS thin film solar cells, which deliver higher conversion efficiency than the CIS version, were produced. Nowadays, CIGS solar cells are mass-produced mainly by a vacuum-based process. In addition, a CIGS solar cell often requires a buffer layer, typically a cadmium sulfide (CdS) layer, because the operation of a CIGS solar cell depends chiefly on photoelectric conversion taking place at the heterojunction between the n-type cadmium sulfide layer and a p-type light-absorbing layer.

Furthermore, for a solar cell to have high photoelectric conversion efficiency, its band gap must be at least between 1.1 eV and 1.7 eV. In U.S. Pat. Nos. 5,078,804 and 5,141,564, a band gap ranging from 1.0 eV to 1.7 eV is achieved by adjusting the indium (In)/gallium (Ga) concentration ratios in the light-absorbing layer to different values.

Moreover, referring to FIG. 1, U.S. Pat. No. 5,981,868 teaches a thin film solar cell 1 which includes a glass substrate 2, a metallic back electrode layer 3, a light-absorbing layer 4, a light-absorbing surface layer 41, a buffer layer 5, a window layer 6, and an upper electrode layer 7. Light enters the thin film solar cell 1 in a direction indicated by S. The light-absorbing surface layer 41 is formed by sputtering gallium and indium onto a surface portion of the photoconductive layer 4 that is adjacent to the buffer layer 5 while adjusting the gallium/indium concentration ratio throughout the sputtering process. Thus, the light-absorbing surface layer 41 widens the band gap, and consequently the light absorption band, of the thin film solar cell 1, thereby enabling the thin film solar cell 1 to reach the optimal photoelectric conversion efficiency of 13.6%.

However, the method for making the foregoing CIGS thin film solar cell requires that the light-absorbing layer be formed in a vacuum environment, and the buffer layer in a general atmospheric environment; hence, the manufacturing process is rather complicated. More specifically, after the buffer layer is prepared, the semi-product must by transferred to a vacuum environment so as for the window layer to be deposited on the buffer layer. Apart from that, the junction between the buffer layer and the photoconductive layer is a heterojunction and therefore is highly prone to defects. Also, the cadmium sulfide (CdS) layer serving as the buffer layer contains cadmium (Cd), which is a poisonous substance and may lead to pollution during use. Besides, as gallium and indium are both rare elements, use of these elements in large quantity incurs high production costs.

BRIEF SUMMARY OF THE INVENTION

To overcome the shortcomings of the aforementioned prior art, the present invention provides a stacked-layered thin film solar cell and a manufacturing method thereof. The thin film solar cell at least includes a front electrode layer, a stacked-layered light-absorbing structure formed by co-evaporation, and a back electrode layer. The stacked-layered light-absorbing structure, which includes a p-type layer, a p-i-n-type layer, and an n-type layer, consists essentially of I-III-VI compounds, wherein the group III elements at least include aluminum (Al) and indium (In). In addition, the p-type layer is near the front electrode layer while the n-type layer is near the back electrode layer. Moreover, the Al/In concentration ratio in the p-type layer is higher than that in the n-type layer.

Therefore, it is a primary objective of the present invention to provide a stacked-layered thin film solar cell, wherein the concentration ratios between the ingredients of compounds in a stacked-layered light-absorbing structure are adjusted by co-evaporation through the use of aluminum, thereby extending the band gap gradient of the stacked-layered photoconductive structure from 3.49 eV to 1.04 eV. Thus, a wide band gap is formed to expand the light absorption band of the stacked-layered thin film solar cell.

It is a secondary objective of the present invention to provide a stacked-layered thin film solar cell, wherein the concentration ratios between the ingredients of compounds in a stacked-layered light-absorbing structure are adjusted by co-evaporation through the use of indium, thereby forming a p-i-n-type structure similar to a homojunction structure. Hence, electrons and holes at the junction are reduced to minimize the occurrence of defects.

It is another objective of the present invention to provide a stacked-layered thin film solar cell, wherein a stacked-layered light-absorbing structure has a p-i-n-type structure that is similar to a homojunction structure. In consequence, electrons can be transferred without the tunnel effect, and the probability of electron transfer is therefore increased.

It is yet another objective of the present invention to provide a stacked-layered thin film solar cell having a stacked-layered light-absorbing structure configured as a p-i-n-type structure. Consequently, there is no need to form a buffer layer through additional chemical bath deposition (CBD), and band gap discontinuity, which may otherwise occur at a heterojunction, is thus prevented.

It is still another objective of the present invention to provide a stacked-layered thin film solar cell having a stacked-layered light-absorbing structure configured as a p-i-n-type structure, so there is no need to form a buffer layer through additional chemical bath deposition. Because of that, use of cadmium sulfide can be dispensed with to prevent pollution.

It is a further objective of the present invention to provide a stacked-layered thin film solar cell having a stacked-layered light-absorbing structure configured as a p-i-n-type structure, so there is no need to form a buffer layer through additional chemical bath deposition. Hence, the manufacturing process is simplified to effectively increase production.

It is yet another objective of the present invention to provide a stacked-layered thin film solar cell, wherein the usage of the precious metal indium is reduced to lower production costs.

It is still another objective of the present invention to provide a manufacturing method of a stacked-layered thin film solar cell, wherein the concentration ratios between the ingredients of compounds in a stacked-layered light-absorbing structure are adjusted by co-evaporation through the use of aluminum, thereby extending the band gap gradient of the stacked-layered light-absorbing structure from 3.49 eV to 1.04 eV. Thus, a wide band gap is formed to expand the light absorption band of a resultant stacked-layered thin film solar cell.

It is another objective of the present invention to provide a manufacturing method of a stacked-layered thin film solar cell, wherein the concentration ratios between the ingredients of compounds in a stacked-layered light-absorbing structure are adjusted by co-evaporation through the use of indium, thereby forming a p-i-n-type structure similar to a homojunction structure. Hence, electrons and holes at the junction are reduced to minimize the occurrence of defects.

It is a further objective of the present invention to provide a manufacturing method of a stacked-layered thin film solar cell which is formed with a stacked-layered light-absorbing structure having a p-i-n-type structure similar to a homojunction structure. In consequence, electrons can be transferred without the tunnel effect, and the probability of electron transfer is therefore increased.

It is yet another objective of the present invention to provide a manufacturing method of a stacked-layered thin film solar cell which is formed with a stacked-layered light-absorbing structure configured as a p-i-n-type structure. As a result, there is no need to form a buffer layer through additional chemical bath deposition, and band gap discontinuity, which may otherwise occur at a heterojunction, is thus prevented.

It is still another objective of the present invention to provide a manufacturing method of a stacked-layered thin film solar cell which is formed with a stacked-layered light-absorbing structure configured as a p-i-n-type structure, so there is no need to form a buffer layer through additional chemical bath deposition. Because of that, use of cadmium sulfide can be dispensed with to prevent pollution.

It is a further objective of the present invention to provide a manufacturing method of a stacked-layered thin film solar cell which is formed with a stacked-layered light-absorbing structure configured as a p-i-n-type structure, so there is no need to form a buffer layer through additional chemical bath deposition. Hence, the manufacturing process is simplified to effectively increase production.

It is yet another objective of the present invention to provide a manufacturing method of a stacked-layered thin film solar cell, wherein the usage of the precious metal indium is reduced so that a stacked-layered thin film solar cell thus manufactured has low production costs.

BRIEF DESCRIPTION OF THE SEVERAL VIEWS OF THE DRAWINGS

The invention as well as a preferred mode of use, further objectives, and advantages thereof will be best understood by referring to the following detailed description of illustrative embodiments in conjunction with the accompanying drawings, in which.

DETAILED DESCRIPTION OF THE INVENTION

The present invention provides a stacked-layered thin film solar cell and a manufacturing method thereof, wherein the principle of photoelectric conversion of solar cells is well known to a person of ordinary skill in the art and therefore will not be detailed herein. Besides, it is to be understood that the drawings referred to in the following description are intended to demonstrate features of the present invention only schematically, so the drawings are not necessarily drawn to scale.

Figure 1:
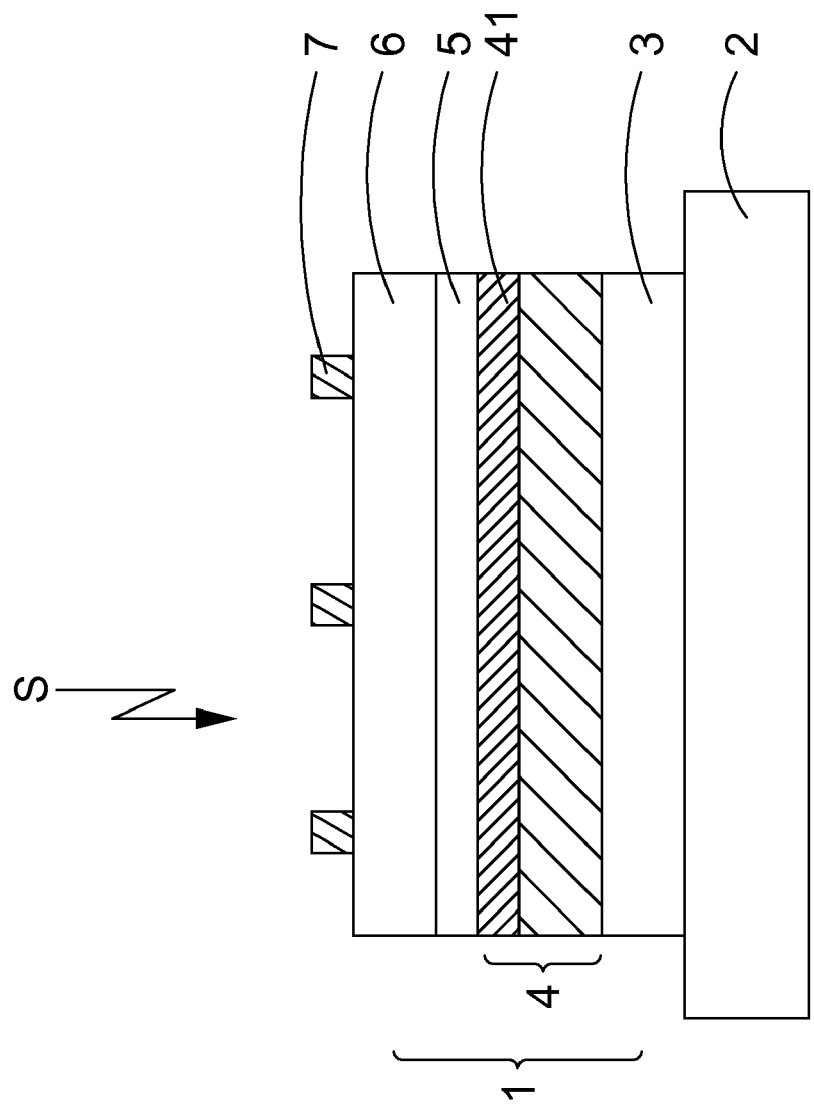
FIG. 1 is a sectional view of a thin film solar cell in the prior art.
Figure 2A:
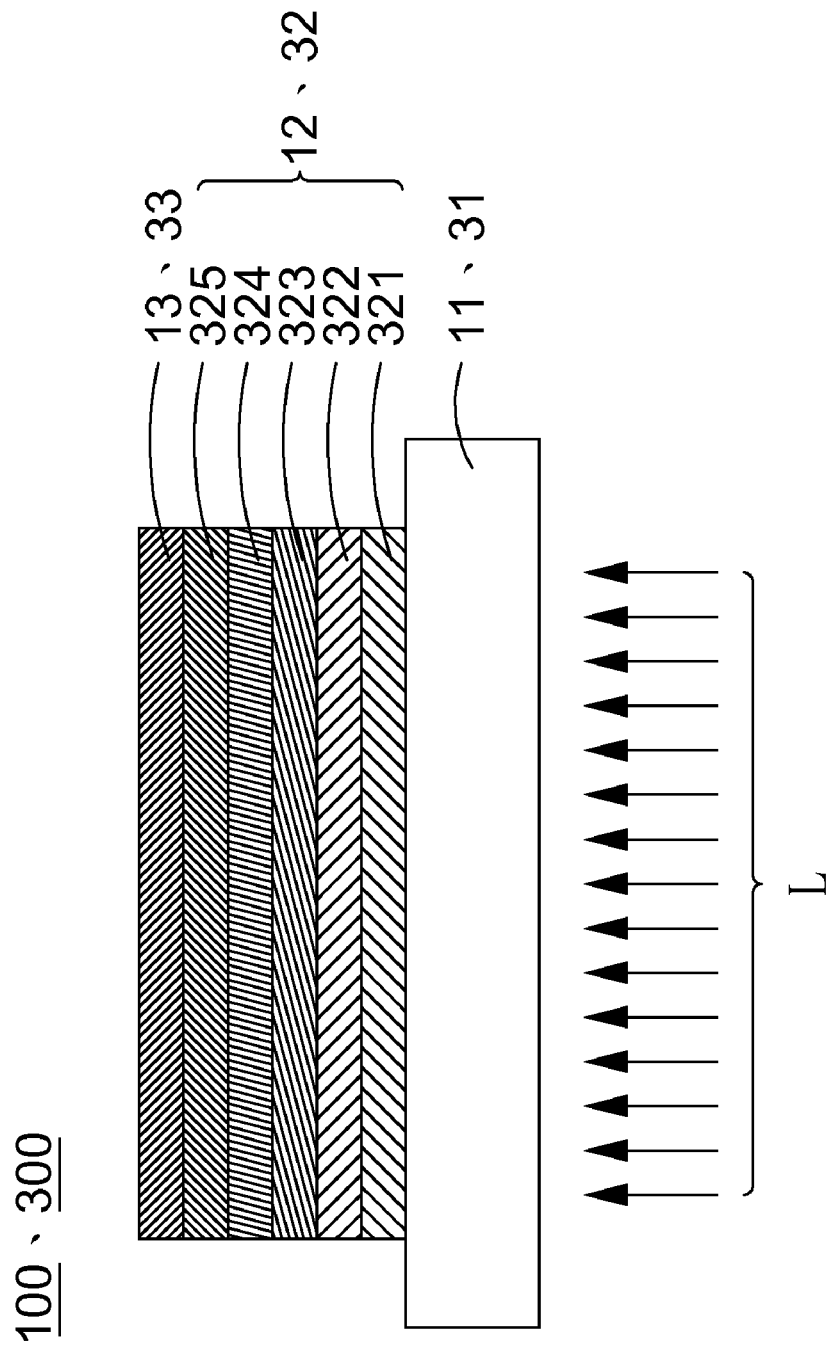
FIG. 2A is a sectional view of a stacked-layered thin film solar cell according to a first and a third preferred embodiment of the present invention.

Referring to FIG. 2A for a first preferred embodiment of the present invention, a stacked-layered thin film solar cell 100 at least includes a transparent front electrode layer 11, a stacked-layered light-absorbing structure 12, and a metallic back electrode layer 13 sequentially stacked up. The stacked-layered light-absorbing structure 12 includes a p-type layer, a p-i-n-type layer, and an n-type layer so as to form a p-i-n-type structure. The stacked-layered light-absorbing structure 12 consists essentially of I-III-VI compounds, in which: the group I elements at least include copper, the group III elements at least include aluminum and indium, and the group VI elements at least include sulfur or selenium. The p-type layer of the stacked-layered light-absorbing structure 12 is near the front electrode layer 11 while the n-type layer of the stacked-layered light-absorbing structure 12 is near the back electrode layer 13. In addition, the p-type layer has a higher aluminum/indium concentration ratio than the n-type layer.

The present invention is characterized mainly by using co-evaporation to form the stacked-layered light-absorbing structure 12 as a p-i-n-type structure. It is well known in the art that a product made by co-evaporation features high uniformity. Therefore, by co-evaporation, the concentrations of the various group I, III, and VI elements in the stacked-layered light-absorbing structure 12 can be adjusted according to different ratios during specific time intervals. As revealed by the experiment results of the present invention, the stacked-layered light-absorbing structure 12 is formed into a p-i-n-type structure by adjusting the concentration of indium according to different ratios through co-evaporation performed in specific time intervals. After that, co-evaporation or sulfuration is further performed on a surface of the stacked-layered photoconductive structure 12 to fill vacancies and dangling bonds of selenium, thereby enhancing the efficiency of light absorption and conversion.

Figure 2B:
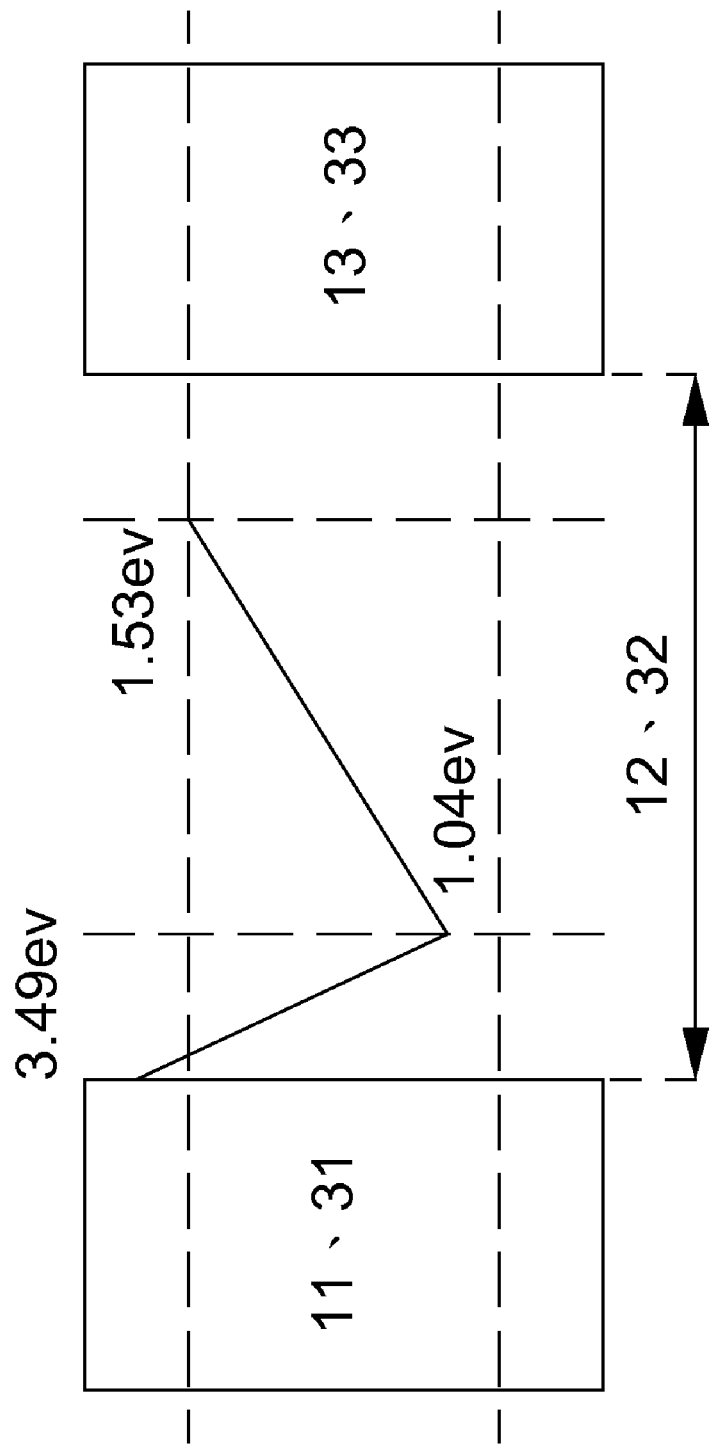
FIG. 2B is a schematic diagram showing the band gap gradient obtained according to the first and the third preferred embodiments of the present invention.

In the present invention, the concentration of aluminum in the stacked-layered light-absorbing structure 12 is adjusted according to different ratios during specific time intervals, before the stacked-layered light-absorbing structure 12 is sulfurated. According to the experiment results, the stacked-layered light-absorbing structure 12 has a band gap gradient spanning from 3.49 eV to 1.04 eV, as illustrated in FIG. 2B. Thus, a wide band gap structure is formed, and the light absorption band of the stacked-layered thin film solar cell 100 is increased. Furthermore, since the stacked-layered light-absorbing structure 12 is similar to a homojunction structure, the need to form a buffer layer through additional chemical bath deposition is eliminated, thereby preventing band gap discontinuity which may otherwise result from a heterojunction; moreover, electrons and holes at the junction are reduced to minimize the occurrence of defects. Besides, as electrons need not be transferred through the tunnel effect, the probability of electron transfer is raised. In addition, the omission of buffer layers from the present invention also contributes to eliminating certain processes in the prior art, such as preparing the buffer layer and then transferring the semi-product formed with the buffer layer to a vacuum environment so as for a window layer to be deposited on the buffer layer. Hence, the present invention provides a relatively simple manufacturing process, which in turn increases production effectively. It is an important feature of the present invention that the usage of the precious metal indium is reduced to effectively lower production costs.

Referring back to FIG. 2A, light enters the stacked-layered thin film solar cell 100 in a direction indicated by L. The front electrode layer 11 can be further used as a substrate or a window layer so as to reduce the steps of the manufacturing process. The front electrode layer 11 is a single-layer or multilayered transparent conductive oxide (TCO) made of any of the following materials: tin dioxide ($SnO_2$), indium tin oxide (ITO), zinc oxide (ZnO), aluminum-doped zinc oxide (AZO), gallium-doped zinc oxide (GZO), and indium zinc oxide (IZO). The back electrode layer 13 has a single-layer or multilayered structure and at least includes a metal layer, wherein the metal layer is made of any one of silver (Ag), aluminum (Al), chromium (Cr), titanium (Ti), nickel (Ni), molybdenum (Mo), copper (Cu), platinum (Pt), and gold (Au). The back electrode layer 13 may further include a transparent conductive oxide made of any of the following materials: tin dioxide, indium tin oxide, zinc oxide, aluminum-doped zinc oxide, gallium-doped zinc oxide, and indium zinc oxide.

Figure 3A:
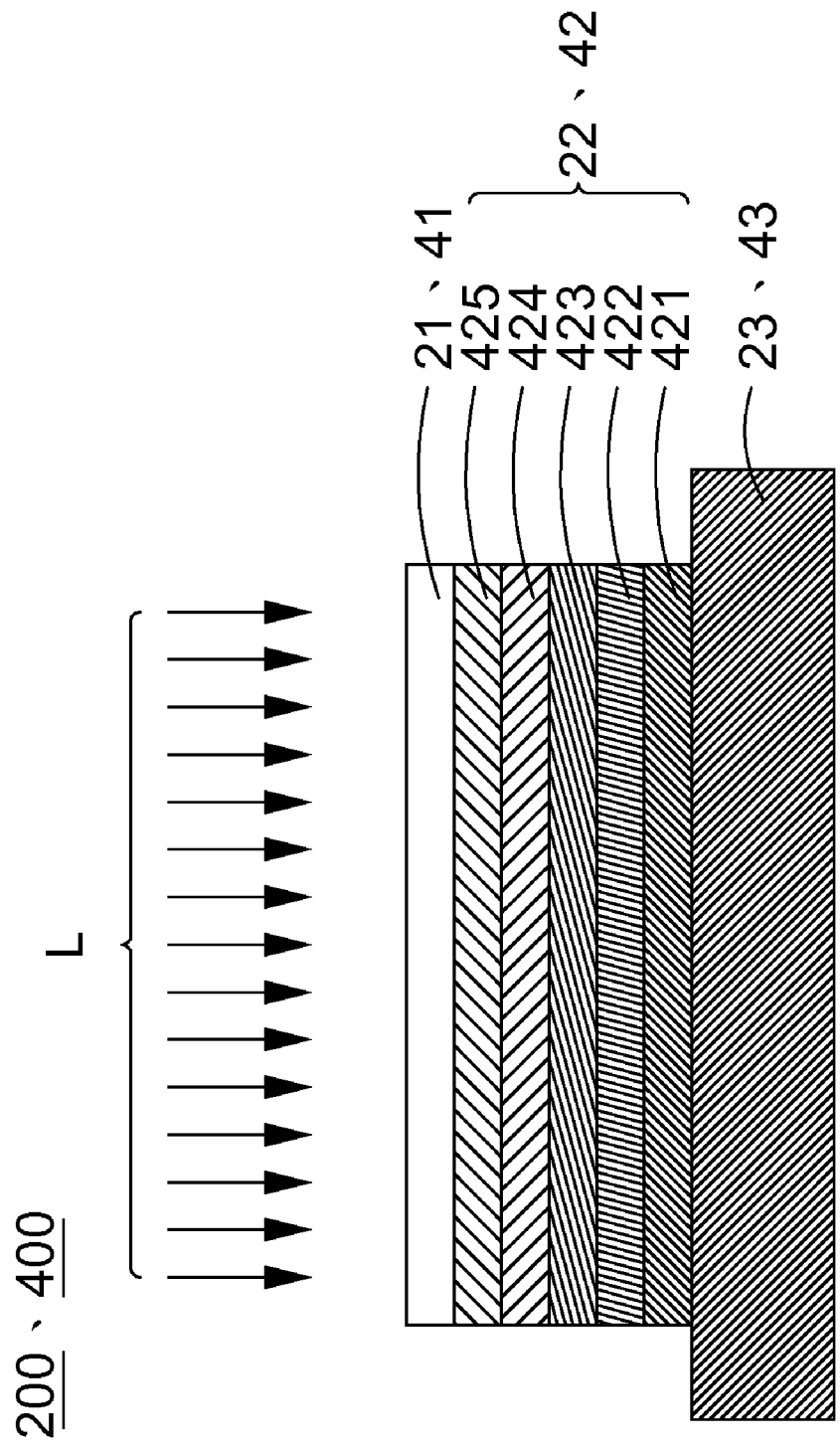
FIG. 3A is a sectional view of a stacked-layered thin film solar cell according to a second and a fourth preferred embodiment of the present invention.
Figure 3B:
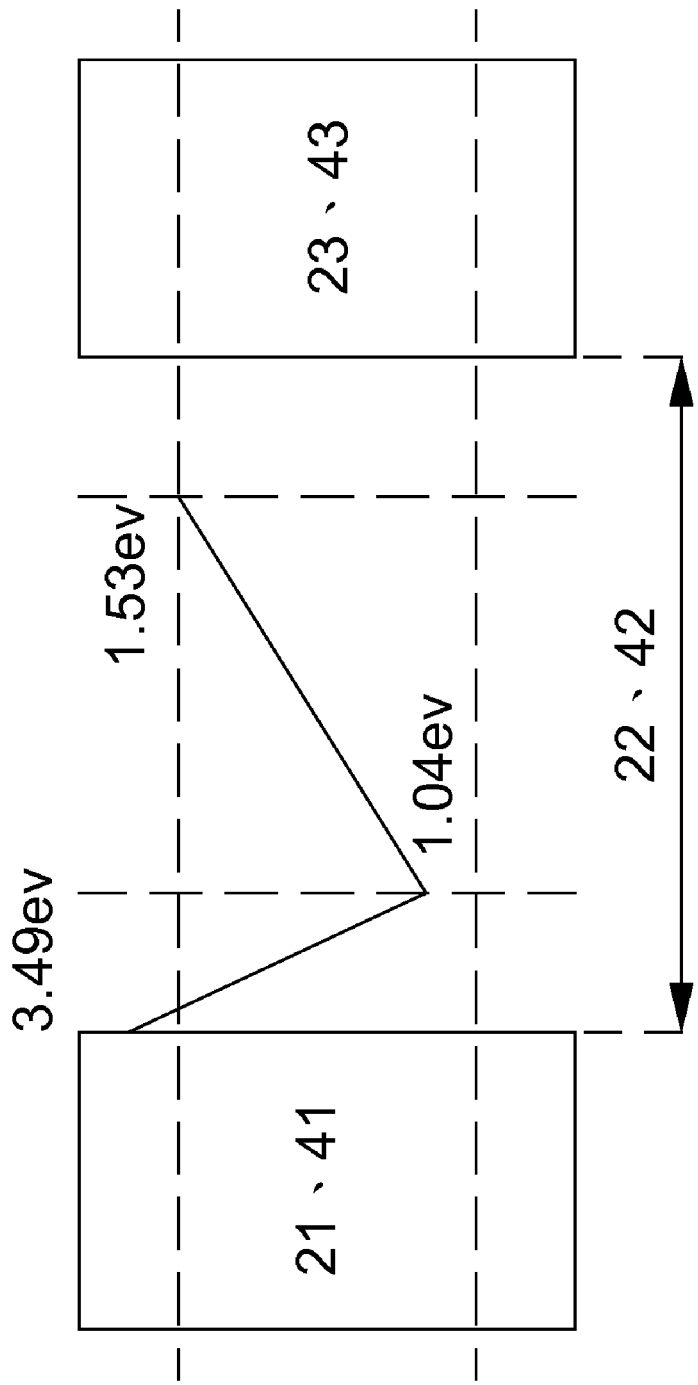
FIG. 3B is a schematic diagram showing the band gap gradient obtained according to the second and the fourth preferred embodiments of the present invention.

Please refer to FIG. 3A and FIG. 3B for a second preferred embodiment of the present invention. A stacked-layered thin film solar cell 200 at least includes a metallic back electrode layer 23, a stacked-layered light-absorbing structure 22, and a transparent front electrode layer 21 sequentially stacked up. The stacked-layered light-absorbing structure 22 has a stacked-layered structure that includes an n-type layer, a p-i-n-type layer, and a p-type layer. The stacked-layered light-absorbing structure 22 consists essentially of I-III-VI compounds, in which: the group I elements at least include copper, the group III elements at least include aluminum or indium, and the group VI elements at least include sulfur or selenium. The p-type layer of the stacked-layered light-absorbing structure 22 is near the front electrode layer 21 while the n-type layer of the stacked-layered light-absorbing structure 22 is near the back electrode layer 23. Moreover, the p-type layer has a higher aluminum/indium concentration ratio than the n-type layer. The present embodiment differs from the first preferred embodiment mainly in the stacking sequence. More specifically, the stacking sequence in the first preferred embodiment is: the front electrode layer 11, the stacked-layered light-absorbing structure 12, and then the back electrode layer 13, whereas the stacking sequence in the second preferred embodiment is: the back electrode layer 23, the stacked-layered light-absorbing structure 22, and the front electrode layer 21. Furthermore, in the second preferred embodiment, the front electrode layer 21 can be further configured as a window layer, and the back electrode layer 23 can be further configured as a substrate. Other features of the stacked-layered thin film solar cell 200 in the present embodiment are identical to those described in the first preferred embodiment.

Please refer again to FIG. 2A for a manufacturing method of a stacked-layered thin film solar cell 300 according to a third preferred embodiment of the present invention. The stacked-layered thin film solar cell 300 is formed by stacking sequentially a front electrode layer 31, a stacked-layered light-absorbing structure 32, and a back electrode layer 33, wherein the stacked-layered light-absorbing structure 32 has a stacked-layered structure that includes a p-type layer, a p-i-n-type layer, and an n-type layer. More particularly, the stacked-layered light-absorbing structure 32 includes a first light-absorbing layer 321, a second light-absorbing layer 322, a third light-absorbing layer 323, a fourth light-absorbing layer 324, and a fifth light-absorbing layer 325. The stacked-layered light-absorbing structure 32 consists essentially of I-III-VI compounds, in which the group III elements at least include aluminum and indium. The manufacturing method includes the steps of:

(1) forming the front electrode layer 31, wherein the front electrode layer 31 can be further configured as a window layer or a substrate;

(2) forming the first light-absorbing layer 321, which has a p-type layer structure, on the front electrode layer 31 by means of co-evaporation such that the first light-absorbing layer 321 is formed as copper aluminum sulfide ($CuAlS_2$);

(3) forming the second light-absorbing layer 322, which has a p-type layer structure, on the first light-absorbing layer 321 by means of co-evaporation, during which the concentration of sulfur is gradually decreased while the concentration of selenium is gradually increased, such that the second light-absorbing layer 322 is gradually formed as copper aluminum selenide ($CuAlSe_2$);

(4) forming the third light-absorbing layer 323, which has a p-type layer structure, on the second light-absorbing layer 322 by means of co-evaporation, during which the concentration of aluminum is gradually decreased while the concentration of indium is gradually increased, such that the third light-absorbing layer 323 is formed as copper aluminum indium selenide ($Cu(Al_{1-X}In_X)Se_2$, where X satisfies the condition: $0 \leq X \leq 1$);

(5) forming the fourth photoconductive layer 324, which has a p-i-n-type layer structure, on the third light-absorbing layer 323 by means of co-evaporation, during which the concentration of indium is gradually increased such that the fourth light-absorbing layer 324 is formed as copper indium selenide ($CuInSe_2$);

(6) forming the fifth light-absorbing layer 325, which has an n-type layer structure, on the fourth light-absorbing layer 324 by means of co-evaporation, during which the concentration of selenium is gradually decreased while the concentration of sulfur is increased such that the fifth light-absorbing layer 325 is formed as copper indium sulfide ($CuInS_2$);

(7) performing a reaction process on a surface of the fifth light-absorbing layer 325 so as to fill vacancies and dangling bonds of selenium, wherein the reaction process is co-evaporation or sulfuration; and (8) forming the back electrode layer 33 on the fifth light-absorbing layer 325.

According to the manufacturing method of the present invention, the stacked-layered light-absorbing structure 32 is formed as a p-i-n-type structure with a wide band gap. The stacked-layered light-absorbing structure 32 consists essentially of I-III-VI compounds. Various group I, III, and VI elements of different concentration ratios are deposited by co-evaporation, one layer on top of another, during specific time intervals so as to form the stacked-layered light-absorbing structure 32. It is an important feature of the manufacturing method of the present invention that the group III elements at least include aluminum and indium. By adjusting the concentration of aluminum according to different ratios during specific time intervals, the band gap gradient of the stacked-layered light-absorbing structure 32 is extended from 3.49 eV to 1.04 eV, thus forming a wide band gap. Moreover, by adjusting the concentration of indium according to different ratios during specific time intervals, the stacked-layered light-absorbing structure 32 is formed into a p-i-n-type structure. Other features of the stacked-layered thin film solar cell 300 in the present embodiment are identical to those described in the first preferred embodiment.

Please refer again to FIG. 3A for a manufacturing method of a stacked-layered thin film solar cell 400 according to a fourth preferred embodiment of the present invention. The stacked-layered thin film solar cell 400 is formed by sequentially stacking a back electrode layer 43, a stacked-layered light-absorbing structure 42, and a front electrode layer 41, wherein the stacked-layered light-absorbing structure 42 has a stacked-layered structure that includes an n-type layer, a p-i-n-type layer, and a p-type layer. More specifically, the stacked-layered light-absorbing structure 42 includes a first light-absorbing layer 421, a second light-absorbing layer 422, a third light-absorbing layer 423, a fourth light-absorbing layer 424, and a fifth light-absorbing layer 425. The stacked-layered light-absorbing structure 42 consists essentially of I-III-VI compounds, in which the group III elements at least include aluminum and indium. The manufacturing method includes the steps of:

(1) forming the back electrode layer 43, wherein the back electrode layer 43 can be further configured as a substrate;

(2) forming the first light-absorbing layer 421, which has an n-type layer structure, on the back electrode layer 43 by means of co-evaporation such that the first light-absorbing layer 421 is essentially copper indium sulfide ($CuInS_2$);

(3) forming the second light-absorbing layer 422, which has a p-i-n-type layer structure, on the first light-absorbing layer 421 by means of co-evaporation, during which the concentration of sulfur is gradually decreased while the concentration of selenium is gradually increased, such that the second light-absorbing layer 422 is formed as copper indium selenide ($CuInSe_2$);

(4) forming the third light-absorbing layer 423, which has a p-type layer structure, on the second light-absorbing layer 422 by means of co-evaporation, during which the concentration of aluminum is gradually increased while the concentration of indium is gradually decreased, such that the third light-absorbing layer 423 is formed as copper aluminum indium selenide ($Cu(Al_xIn_{1-x})Se_2$, where X satisfies the condition: $0 \leq X \leq 1$);

(5) forming the fourth light-absorbing layer 424, which has a p-type layer structure, on the third light-absorbing layer 423 by means of co-evaporation, during which the concentration of aluminum gradually increased such that the fourth light-absorbing layer 424 is formed as copper aluminum selenide ($CuAlSe_2$);

(6) forming the fifth light-absorbing layer 425, which has a p-type layer structure, on the fourth light-absorbing layer 424 by means of co-evaporation, during which the concentration of selenium is gradually decreased while the concentration of sulfur is increased such that the fifth light-absorbing layer 425 is formed as copper aluminum sulfide ($CuAlS_2$);

(7) performing a reaction process on a surface of the fifth light-absorbing layer 425 so as to fill vacancies and dangling bonds of selenium, wherein the reaction process is co-evaporation or sulfuration; and (8) forming the front electrode layer 41 on the fifth light-absorbing layer 425, wherein the front electrode layer 41 can be further configured as a window layer.

According to the manufacturing method of the present invention, the stacked-layered light-absorbing structure 42 is formed as a p-i-n-type structure with a wide band gap. The stacked-layered light-absorbing structure 42 consists essentially of I-III-VI compounds. Various group I, III, and VI elements of different concentration ratios are deposited by co-evaporation, one layer on top of another, during specific time intervals so as to form the stacked-layered light-absorbing structure 42. It is an important feature of the manufacturing method of the present invention that the group III elements at least include aluminum and indium. By adjusting the concentration of aluminum according to different ratios during specific time intervals, the band gap gradient of the stacked-layered light-absorbing structure 42 is extended from 3.49 eV to 1.04 eV, thus forming a wide band gap. Moreover, by adjusting the concentration of indium according to different ratios during specific time intervals, the stacked-layered light-absorbing structure 42 is formed into a p-i-n-type structure. Other features of the stacked-layered thin film solar cell 400 in the present embodiment are identical to those described in the second preferred embodiment.

The present invention is described herein by reference to the preferred embodiments, and it is understood that the embodiments are not intended to limit the scope of the present invention. Moreover, as the contents disclosed herein should be readily understood and can be implemented by a person skilled in the art, all equivalent changes or modifications which do not depart from the spirit of the present invention should be encompassed by the appended claims.

What is claimed is:

1. A manufacturing method of a stacked-layered thin film solar cell, comprising steps of:
   forming a transparent front electrode layer;
   forming a stacked-layered light-absorbing structure on the front electrode layer, which comprises steps of:
      forming a first light-absorbing layer, which has a p-type layer structure, on the front electrode layer by co-evaporation;
      forming a second light-absorbing layer, which has a p-type layer structure, on the first light-absorbing layer by co-evaporation;
      forming a third light-absorbing layer, which has a p-type layer structure, on the second light-absorbing layer by co-evaporation;
      forming a fourth light-absorbing layer, which has a p-i-n-type layer structure, on the third light-absorbing layer by co-evaporation;
      forming a fifth light-absorbing layer, which has an n-type layer structure, on the fourth light-absorbing layer by co-evaporation; and
      performing a reaction process on a surface of the fifth light-absorbing layer; and
   forming a back electrode layer, which is made of metal, on the fifth light-absorbing layer of the stacked-layered light-absorbing structure;
   wherein the stacked-layered light-absorbing structure consists essentially of I-III-VI compounds, in which group III elements comprise aluminum and indium.

2. The manufacturing method of claim 1, wherein the stacked-layered light-absorbing structure has a band gap gradient ranging from 3.49 eV to 1.04 eV.

3. The manufacturing method of claim 1, wherein group I elements in the stacked-layered light-absorbing structure comprise copper.

4. The manufacturing method of claim 1, wherein group VI elements in the stacked-layered light-absorbing structure comprise sulfur.

5. The manufacturing method of claim 1, wherein group VI elements in the stacked-layered light-absorbing structure comprise selenium.

6. The manufacturing method of claim 1, wherein the first light-absorbing layer is copper aluminum sulfide ($CuAlS_2$), and the second light-absorbing layer is copper aluminum selenide ($CuAlSe_2$).

7. The manufacturing method of claim 1, wherein the third light-absorbing layer is copper aluminum indium selenide ($Cu(Al_{1-x}In_x)Se_2$, where $0 \leq X \leq 1$).

8. The manufacturing method of claim 1, wherein the fourth light-absorbing layer is copper indium selenide ($CuInSe_2$), and the fifth light-absorbing layer is copper indium sulfide ($CuInS_2$).

9. The manufacturing method of claim 1, wherein the reaction process is co-evaporation for filling vacancies and dangling bonds of selenium.

10. The manufacturing method of claim 1, wherein the reaction process is sulfuration for filling vacancies and dangling bonds of selenium.

11. A manufacturing method of a stacked-layered thin film solar cell, comprising steps of:
   forming a back electrode layer which comprises metal;
   forming a stacked-layered light-absorbing structure on the back electrode layer, which comprises steps of:
      forming a first light-absorbing layer, which has an n-type layer structure, on the back electrode layer by co-evaporation;
      forming a second light-absorbing layer, which has a p-i-n-type layer structure, on the first light-absorbing layer by co-evaporation;
      forming a third light-absorbing layer, which has a p-type layer structure, on the second light-absorbing layer by co-evaporation;
      forming a fourth light-absorbing layer, which has a p-type layer structure, on the third light-absorbing layer by co-evaporation;
      forming a fifth light-absorbing layer, which has a p-type layer structure, on the fourth light-absorbing layer by co-evaporation; and
      performing a reaction process on a surface of the fifth light-absorbing layer; and
   forming a transparent front electrode layer on the fifth light-absorbing layer of the stacked-layered light-absorbing structure;
   wherein the stacked-layered light-absorbing structure consists essentially of I-III-VI compounds, in which group III elements comprise aluminum and indium.

12. The manufacturing method of claim 11, wherein the stacked-layered light-absorbing structure has a band gap gradient ranging from 3.49 eV to 1.04 eV.

13. The manufacturing method of claim 11, wherein group I elements in the stacked-layered light-absorbing structure comprise copper.

14. The manufacturing method of claim 11, wherein group VI elements in the stacked-layered light-absorbing structure comprise sulfur.

15. The manufacturing method of claim 11, wherein group VI elements in the stacked-layered light-absorbing structure comprise selenium.

16. The manufacturing method of claim 11, wherein the first light-absorbing layer is copper indium sulfide ($CuInS_2$), and the second light-absorbing layer is copper indium selenide ($CuInSe_2$).

17. The manufacturing method of claim 11, wherein the third light-absorbing layer is copper aluminum indium selenide ($Cu(Al_xIn_{1-x})Se_2$, where $0 \leq X \leq 1$).

18. The manufacturing method of claim 11, wherein the fourth light-absorbing layer is copper aluminum selenide ($CuAlSe_2$), and the fifth light-absorbing layer is copper aluminum sulfide ($CuAlS_2$).

19. The manufacturing method of claim 11, wherein the reaction process is co-evaporation for filling vacancies and dangling bonds of selenium.

20. The manufacturing method of claim 11, wherein the reaction process is sulfuration for filling vacancies and dangling bonds of selenium.

* * * * *